(12) United States Patent
Kwan et al.

(10) Patent No.: US 7,691,679 B2
(45) Date of Patent: Apr. 6, 2010

(54) PRE-PLATED LEADFRAME HAVING ENHANCED ENCAPSULATION ADHESION

(75) Inventors: Yiu Fai Kwan, Hong Kong (HK); Tat Chi Chan, Hong Kong (HK); Chun Ho Yau, Hong Kong (HK); Chi Chung Lee, Hong Kong (HK)

(73) Assignee: ASM Assembly Materials Ltd., Hong Kong (HK)

( * ) Notice: Subject to any disclaimer, the term of this patent is extended or adjusted under 35 U.S.C. 154(b) by 0 days.

(21) Appl. No.: 11/690,383

(22) Filed: Mar. 23, 2007

(65) Prior Publication Data

US 2008/0233683 A1   Sep. 25, 2008

(51) Int. Cl.
   *H01L 21/16* (2006.01)
(52) U.S. Cl. ............ 438/123; 438/119; 438/618; 257/E21.514
(58) Field of Classification Search .......... 438/123, 438/118, 111, 112, 124, 127, 618, 629, 632, 438/671, 674, 119; 428/618, 629, 632, 671, 428/674; 257/783, E21.514
See application file for complete search history.

(56) References Cited

U.S. PATENT DOCUMENTS

| | | | |
|---|---|---|---|
| 4,946,518 A | 8/1990 | Spanjer et al. | 148/282 |
| 5,459,103 A | 10/1995 | Kelleher et al. | 437/209 |
| 6,333,252 B1 * | 12/2001 | Jung et al. | 438/612 |
| 6,856,235 B2 * | 2/2005 | Fjelstad | 338/324 |
| 6,953,986 B2 | 10/2005 | Abbott et al. | 257/666 |
| 7,148,085 B2 * | 12/2006 | Abbott et al. | 438/123 |

* cited by examiner

*Primary Examiner*—Julio J Maldonado
(74) *Attorney, Agent, or Firm*—Ostrolenk Faber LLP

(57) ABSTRACT

A process for producing a pre-plated leadframe that has enhanced adhesion by molding compound is provided, wherein a base leadframe material is first plated with multiple layers of metallic material. Thereafter, the plated base leadframe material is covered with a mask, so as to expose selected surfaces thereof at unmasked areas where enhanced adhesion of molding compound is desired. The said unmasked areas are plated with a layer of copper before removing the mask. Optionally, the layer of copper may further be oxidized to form a layer of specially controlled copper oxide.

12 Claims, 5 Drawing Sheets

PRE-PLATED LEADFRAME HAVING ENHANCED ENCAPSULATION ADHESION

FIELD OF THE INVENTION

The invention relates to leadframes commonly used as carriers of semiconductor or integrated circuit chips during the production of semiconductor devices, and in particular to leadframes with surfaces comprising layers of plated material.

BACKGROUND AND PRIOR ART

During the production of semiconductor devices, leadframes are traditionally used as a cost-effective way to mount and process a plurality of semiconductor dice or chips concurrently. Each leadframe typically has a plurality of die pads for mounting the said chips. The leadframe also acts as a means to electrically connect the chip to external devices via leads of the leadframe. Bonding wires are connected to electrical contacts found on the chip and said leads of the leadframe in a process known as wire bonding. The wires usually comprise gold, aluminum or copper material.

After the chips are mounted onto the leadframe and the bonding wire connections are made between the chips and the leadframe, each chip has to be protected from the environment by encapsulating it with a plastic molding compound, such as epoxy molding compound ("EMC"). Each encapsulated chip constitutes a semiconductor package. The multiple semiconductor packages are then singulated or cut to form individual semiconductor devices.

It is important that adhesion between the leadframe material and the molding compound is strong. In the case of copper-based leadframes, adhesion may be reduced due to a layer of loose and uncontrolled native copper oxide forming on the surfaces of the leadframe. The problems associated with this occurrence include delamination of the encapsulant, liquid trapped beneath the encapsulant during packaging and/or liquids seeping or vapors condensing under the encapsulant, leading to mold failure. These problems are addressed in various ways in the prior art. For example, the problems are described in U.S. Pat. No. 4,946,518 entitled "Method for Improving the Adhesion of a Plastic Encapsulant to Copper Containing Leadframes". This patent teaches improving the adhesion of plastic encapsulants to copper leadframes by exposing the copper leadframes to an active oxygen ambient at temperatures below the leadframe annealing temperature. This strengthens any native copper oxide present on the leadframes without increasing the thickness of the leadframes.

In another example, in U.S. Pat. No. 5,459,103 entitled "Method of Forming Lead Frame with Strengthened Encapsulation Adhesion", the leadframe is plated with copper strike and the copper strike is exposed to an oxidizing agent to form a layer of cupric oxide (CuO) that promotes adhesive bonding between the plastic mold and the leadframe.

There are certain types of leadframe widely used in the industry that have multiple layers of material plated onto the leadframe, such as pre-plated frames ("PPF"). A three-layer leadframe plating scheme comprising nickel (Ni), palladium (Pd) and gold (Au) has been widely adopted in the market for over ten years as a green solution for semiconductor packaging. However, the uppermost layer comprising gold plating has lower adhesion strength to EMC than the underlying copper (Cu) material used as a typical leadframe base material. There is an increasing demand from the market for adhesion enhancement of EMC to such nickel-palladium-gold PPF leadframes so as to minimize package delamination.

One present method for adhesion enhancement of EMC to such PPF leadframes is to selectively electroplate nickel, palladium and gold onto certain areas of the leadframe surface by using a mechanical mask or a photo-resist mask, such that the leadframe base copper material can give better EMC adhesion than the uppermost gold layer. However, such an approach increases costs because there is a need to conduct repeated masking to selectively plate each layer of material only at certain portions of the leadframe, while leaving the rest of the base material unplated. Furthermore, by repeatedly applying and removing masks, there is a possibility of misalignment during each application, potentially causing quality issues or functional failure.

When using other masking methods such as using a photo-resist mask (negative dry film) instead of mechanical masking, the disadvantage is that masking is usually done prior to formation of the leadframe pattern by either stamping or etching. As a result, there will be exposed copper on the side walls of the external leads, which are more prone to solder non-wetting. On the other hand, when using a photo-resist mask (negative wet film), the disadvantage is that development of photo-resist on the side wall of the leads by UV exposure is very difficult, and thus the side wall of the lead may again be subject to solder non-wetting. It is therefore very hard to maintain a consistent quality.

In an alternative approach, U.S. Pat. No. 6,953,986 entitled "Leadframes for High Adhesion Semiconductor Devices and Method of Fabrication" discloses the selective plating of a noble metal in the form of thick palladium onto some areas of the leadframe while allowing the rest of the leadframe to have nickel diffusing up to the surface of the leadframe to form nickel oxide. Nickel oxide is believed to have better EMC adhesion than typical nickel or palladium. Nevertheless, the high cost of palladium and thus the expense associated with the need to plate palladium to about 70-80 nm thick on each leadframe is a deterrent.

SUMMARY OF THE INVENTION

It is thus an object of the invention to seek to provide a pre-plated leadframe that promotes adhesion of EMC to it, using material that is relatively cheaper than noble metals and offers high adhesion strength to the EMC material.

Accordingly, the invention provides a method for producing a pre-plated leadframe that has enhanced adhesion by molding compound to it, comprising the steps of: providing a base leadframe material; plating the base leadframe material with multiple layers of metallic material; covering the plated base leadframe material with a mask so as to expose selected surfaces thereof at unmasked areas where enhanced adhesion of molding compound is desired; plating the said unmasked areas with a layer of copper; and thereafter removing the mask.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of pre-plated leadframes and methods of manufacturing the same in accordance with the invention will now be described with reference to the accompanying drawings, in which.

DETAILED DESCRIPTION OF THE PREFERRED EMBODIMENT OF THE INVENTION

Figure 1:
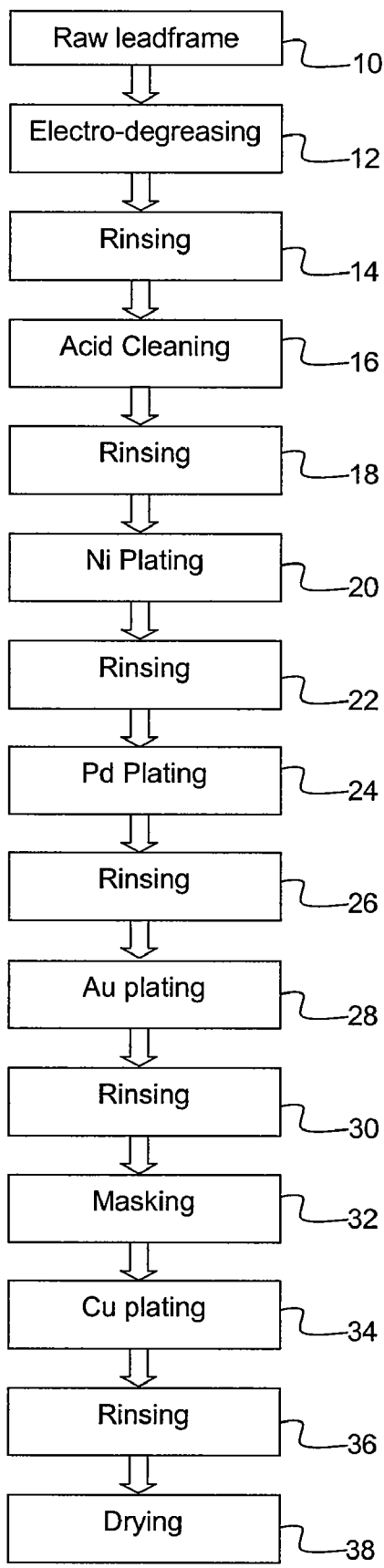
FIG. 1 is a selective copper plating process according to the first preferred embodiment of the invention to produce a pre-plated leadframe that has enhanced adhesion by molding compound to it.

FIG. 1 is a selective copper plating process according to the first preferred embodiment of the invention to produce a pre-plated leadframe that has enhanced adhesion of molding compound to it. A base leadframe material for a leadframe 10 is provided in the form of a metallic strip, which may be made of copper or copper alloy, and it is first cleaned by electro-degreasing 12. It is then rinsed 14.

The next step is acid cleaning 16 to activate the materials in the raw leadframe 10 so as to prepare for subsequent plating. The acid preferably comprises a mineral acid such as hydrochloric acid, phosphoric acid, sulfuric acid, nitric acid or a mixture thereof. Thereafter, the leadframe 10 is rinsed 18 to remove the acid.

The leadframe 10 is then plated with multiple layers of metallic material. Plating may commence by plating the leadframe 10 with a layer of nickel (Ni) 20. The nickel layer is preferably plated over substantially the whole of the leadframe 10. The leadframe is then rinsed 22. Thereafter, a layer of palladium (Pd) is plated 24 preferably over substantially the whole of the leadframe 10, on top the nickel layer. The leadframe 10 is rinsed 26 after plating. Finally, a layer of gold is plated 28 on top of the nickel and palladium layers, preferably over substantially the whole of the leadframe 10, and the leadframe 10 is rinsed again 30.

After plating the various layers of material as stated above, it is then necessary to treat the leadframe 10 to enhance adhesion of encapsulation material to the leadframe 10. For this purpose, areas of the leadframe 10 which do not require encapsulant adhesion, or which require increased solderability offered by the gold plating, are covered by masking 32. After masking, copper plating is selectively plated 34 onto the multiple layers of metallic material that have been plated, essentially on top of the topmost gold layer. After copper plating, the leadframe 10 is rinsed 36, after which it is sent for drying 38.

Figure 2:
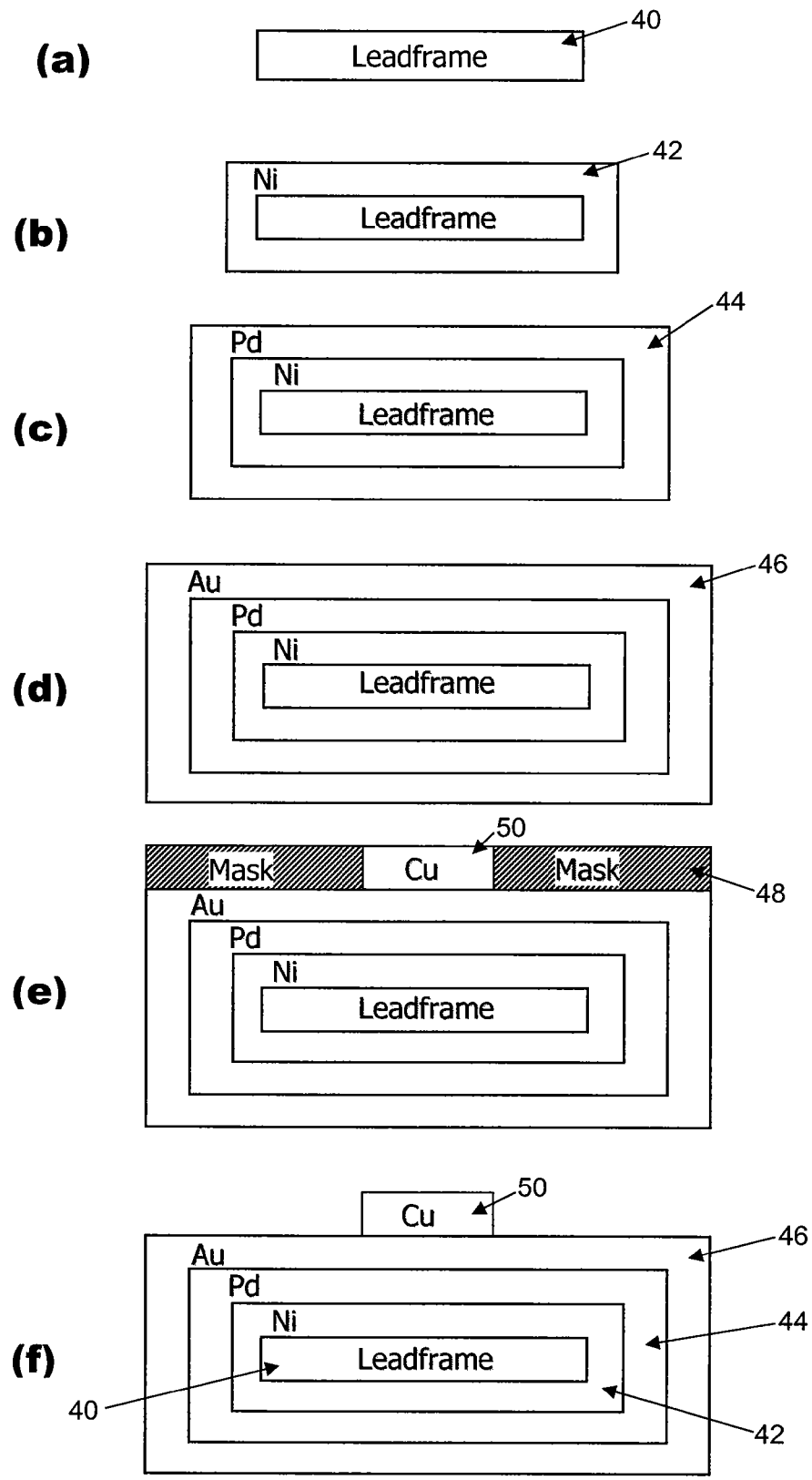
FIG. 2 is an overview of the process steps for selective copper plating according to the first preferred embodiment of the invention.

FIG. 2 is an overview of the process steps for selective copper plating according to the first preferred embodiment of the invention. A leadframe 40 is first plated with a layer of nickel 42 over substantially the whole of the leadframe surface to a thickness of about 0.25-2.5 microns, preferably 0.5-2.0 microns. A layer of palladium 44 is then plated over the nickel 42 layer, to a thickness of about 2.5-100 nm, preferably 2.0-50 nm. Thereafter a layer of gold is plated over substantially the whole of the nickel and palladium layers to a thickness of about 2.5-10 nm, resulting in the pre-plated leadframe illustrated in FIG. 2(d).

In order to selectively plate certain areas of the leadframe with copper, masks 48 are laid over other areas of the leadframe 40 that do not require copper plating. Thus, selected surfaces of the plated leadframe 40 are exposed at unmasked areas where enhanced adhesion of molding compound is desired. A layer of copper 50 is then added to the unmasked areas, to a thickness of about 0.1-10 microns, preferably 3-7 microns. After the said copper plating, the masks 48 are removed, so that a pre-plated nickel-palladium-gold leadframe 40 with copper 50 selectively plated on the gold layer 46 is provided.

Figure 3A:
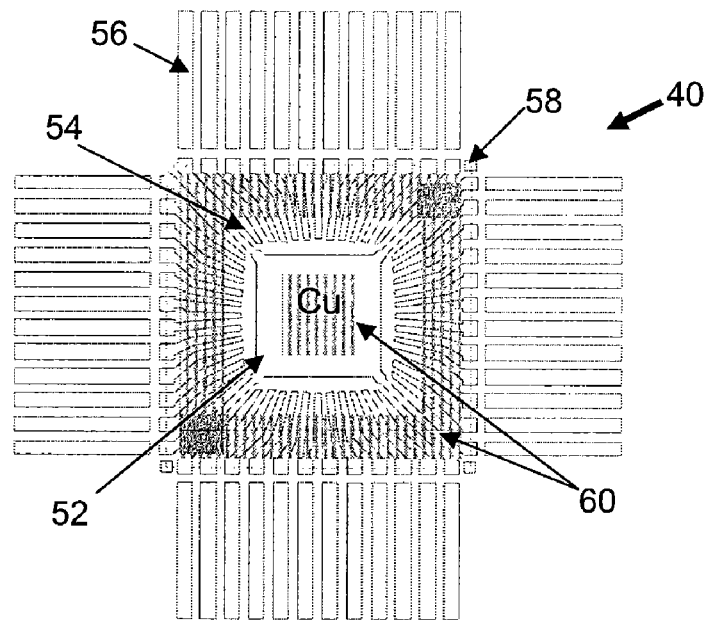
FIGS. 3(a) and 3(b) are plan views of the top and bottom sides respectively of an exemplary leadframe, illustrating coverage of the plated layer of copper on the leadframe.

FIG. 3(a) is a plan view of a top side of an exemplary leadframe 40, illustrating coverage of the plated layer of copper on the leadframe 40. The leadframe 40 generally comprises a die pad 52 for attaching a semiconductor chip (not shown), inner leads 54 and outer leads 56. The leadframe 40 is configured to be encapsulated during molding up to the encapsulation line 58, after which the outer leads 56 are trimmed and formed. In this leadframe 40, the centre of the die pad 52 and a mid-section of the inner leads are plated with a layer of copper 60.

Figure 3B:
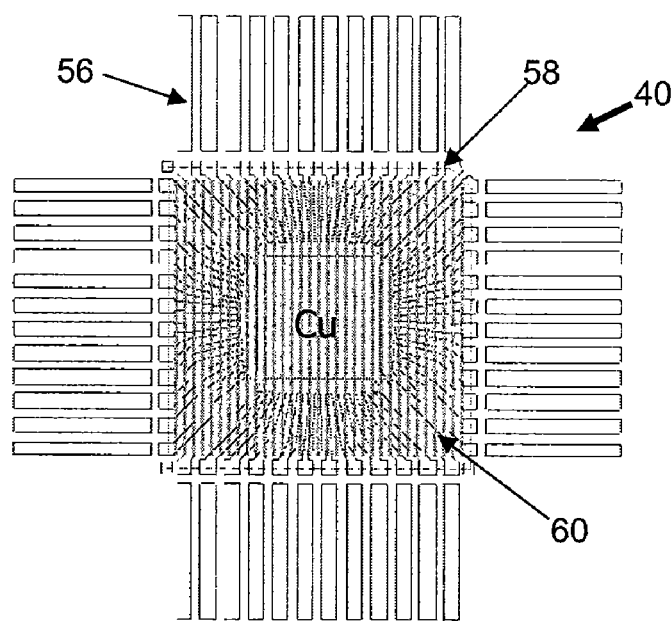

FIG. 3(b) is a plan view of a bottom side of an exemplary leadframe 40, illustrating coverage of the plated layer of copper on the leadframe 40. Copper plating 60 is introduced onto virtually the whole molded surface of the leadframe as this side of the leadframe need not receive a semiconductor chip, but will be in contact with the encapsulation compound.

Figure 4A:
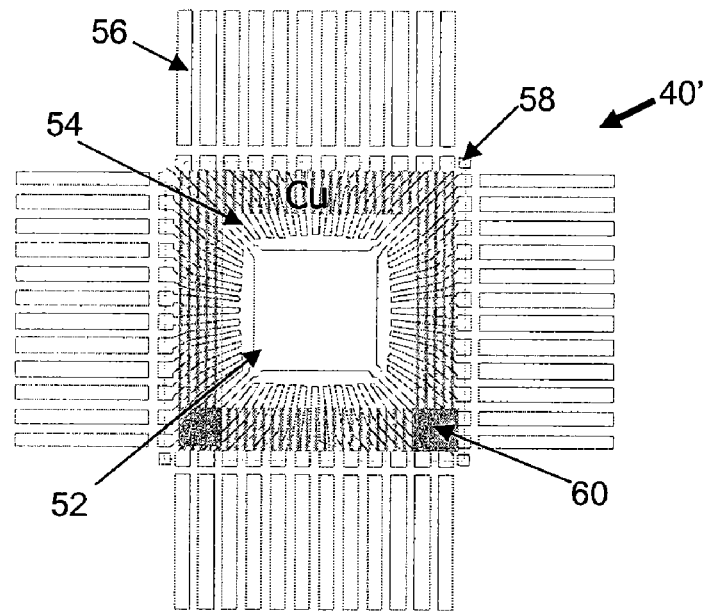
FIGS. 4(a) and 4(b) are plan views of the top and bottom sides respectively of another exemplary leadframe, illustrating coverage of the plated layer of copper on the leadframe.
Figure 4B:
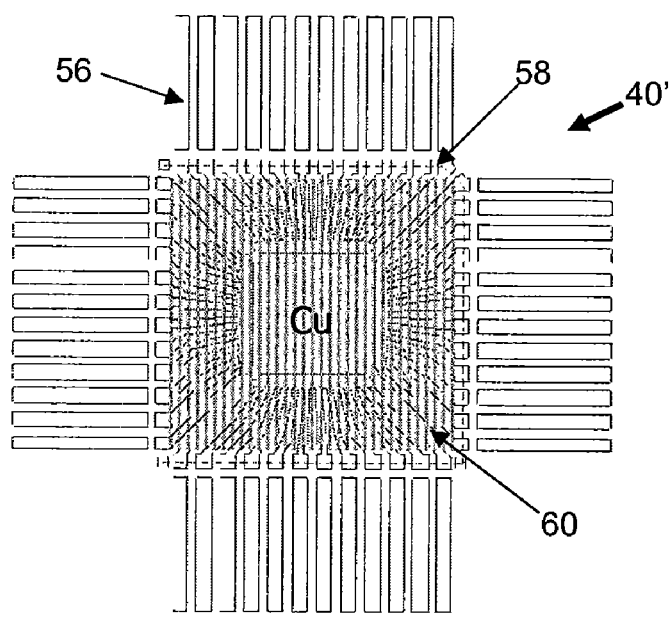

FIG. 4(a) is a plan view of a top side of another exemplary leadframe 40', illustrating coverage of the layer of copper 60 on the leadframe. FIG. 4(b) is a plan view of a bottom side of the leadframe 40'. This is similar to the previously-described leadframe 40, except that the die pad 52 in this embodiment is not plated with copper at all. Therefore, the die pad 52 should be masked during copper plating. On the other hand, a mid-section of the inner leads 54 and an entire bottom surface of the leadframe 40' are plated with copper 60.

Figure 5:
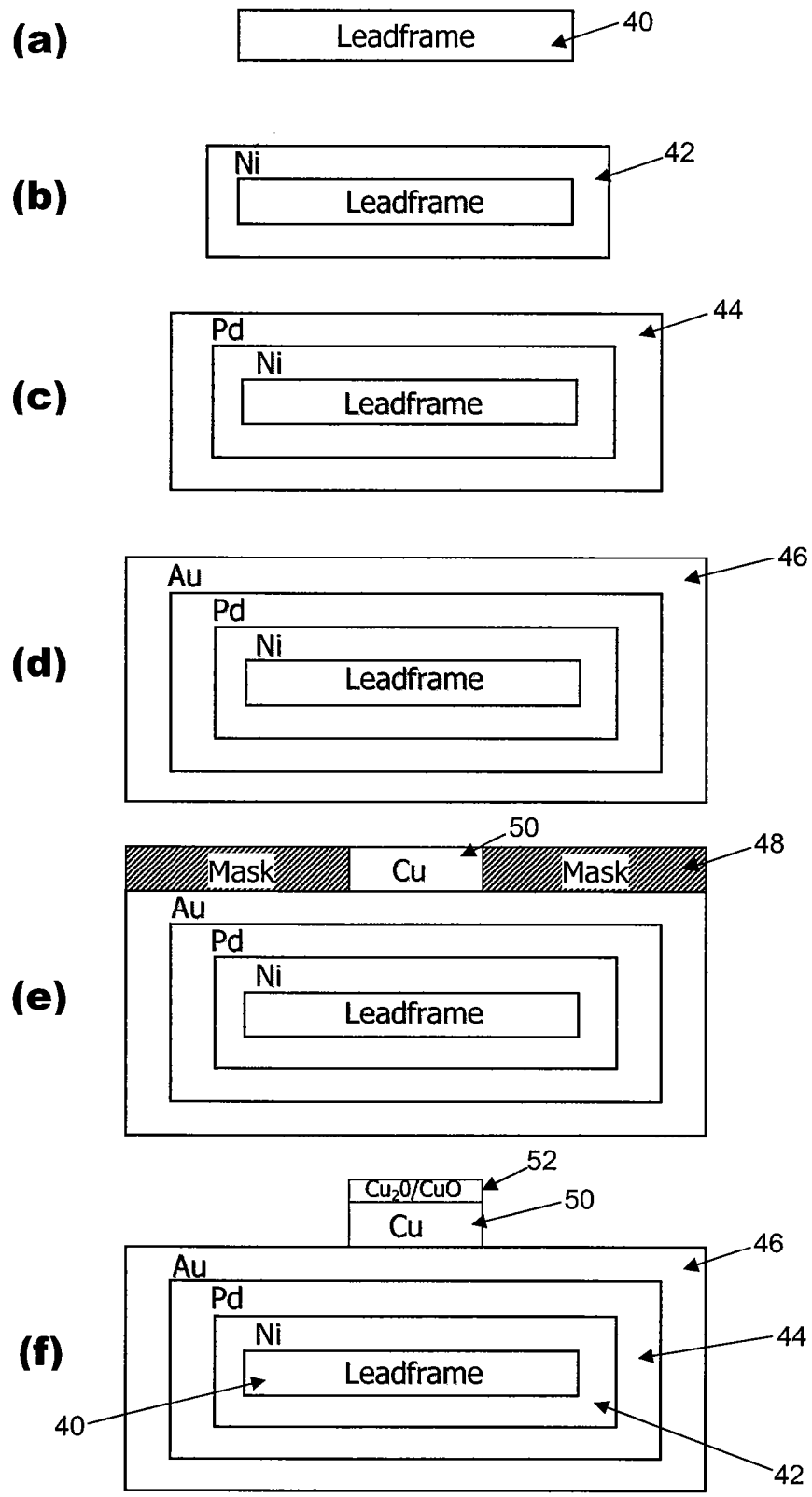
FIG. 5 is an overview of the process steps for selective copper plating process followed by an additional oxidation treatment process according to the second preferred embodiment of the invention.

FIG. 5 is an overview of the process steps for a selective copper plating process followed by an additional oxidation treatment process according to the second preferred embodiment of the invention. The first steps of plating a leadframe 40 with successive nickel 42, palladium 44 and gold 46 layers, and then to selectively plate copper plating 50 are undertaken, as described in relation to FIGS. 2(a)-2(f). Thereafter, the layer of copper 50 that has been selectively plated is treated to form a layer of specially controlled copper oxide 52.

The production of copper oxide 52 may be performed by the use of an oxidizing agent such as hydrogen peroxide, sodium persulfate, sodium chlorite or a mixture of thereof. Exposure of the layer of copper 50 to an oxidizing agent may be done after plating the unmasked areas with copper 50, and either before or after removal of the mask 48. If the mask 48 is not removed during the oxidation process, once oxidation of the copper plating 50 has been completed, the mask 48 is removed. The copper oxide 52 that is thereby formed further enhances adherence of encapsulating molding compound to the leadframe 40, which aids in preventing delamination.

The invention described herein is susceptible to variations, modifications and/or additions other than those specifically described and it is to be understood that the invention includes all such variations, modifications and/or additions which fall within the spirit and scope of the above description.

The invention claimed is:

1. Method for producing a pre-plated leadframe that has enhanced adhesion by a molding compound to it, comprising the steps of:
   providing a base leadframe material;
   plating the base leadframe material with multiple layers of metallic material;
   covering the plated base leadframe material with a mask so as to expose selected surfaces thereof at unmasked areas where enhanced adhesion of the molding compound is desired;
   plating said unmasked areas with a layer of copper to produce an exposed layer of copper onto which the molding compound is to be adhered at the unmasked areas, the molding compound being adhered directly to at least a top surface of the exposed layer of copper; and thereafter
   removing the mask.

2. Method as claimed in claim 1, wherein the multiple layers of metallic material are plated over substantially the whole of the base leadframe material.

3. Method as claimed in claim 1, wherein the multiple layers of metallic material comprise consecutive layers of nickel, palladium and gold plating.

4. Method as claimed in claim 3, wherein the thickness of the layer of nickel is 0.25-2.5 microns.

5. Method as claimed in claim 3, wherein the thickness of the layer of palladium is 2.5-100 nm.

6. Method as claimed in claim 3, wherein the thickness of the layer of gold is 2.5-10 nm.

7. Method as claimed in claim 1, wherein the thickness of the layer of copper is 0.1-10 microns.

8. Method as claimed in claim 1, wherein the molding compound is a plastic molding compound.

9. Method as claimed in claim 1, wherein the molding compound is an epoxy molding compound.

10. Method for producing a pre-plated leadframe that has enhanced adhesion by a molding compound to it, comprising the steps of:
    providing a base leadframe material;
    elating the base leadframe material with multiple layers of metallic material;
    covering the plated base leadframe material with a mask so as to expose selected surfaces thereof at unmasked areas where enhanced adhesion of the molding compound is desired;
    plating said unmasked areas with a layer of copper;
    and thereafter removing the mask, and
    further comprising the step of oxidizing the layer of copper to produce copper oxide.

11. Method as claimed in claim 10, wherein the step of oxidizing the layer of copper comprises the step of exposing the copper to an oxidizing agent after plating the unmasked areas with copper but prior to removing the mask.

12. Method as claimed in claim 10, wherein the step of oxidizing the layer of copper comprises the step of exposing the copper to an oxidizing agent after the step of removing the mask.

* * * * *